(12) United States Patent
Winoto

(10) Patent No.: US 9,178,541 B2
(45) Date of Patent: Nov. 3, 2015

(54) CARTESIAN DIGITAL POWER AMPLIFIER USING COORDINATE ROTATION

(71) Applicant: Marvell World Trade Ltd., St. Michael (BB)

(72) Inventor: Renaldi Winoto, Danville, CA (US)

(73) Assignee: MARVELL WORLD TRADE LTD., St. Michael (BB)

( * ) Notice: Subject to any disclaimer, the term of this patent is extended or adjusted under 35 U.S.C. 154(b) by 0 days.

(21) Appl. No.: 14/522,453

(22) Filed: Oct. 23, 2014

(65) Prior Publication Data
US 2015/0117567 A1 Apr. 30, 2015

Related U.S. Application Data

(60) Provisional application No. 61/895,015, filed on Oct. 24, 2013.

(51) Int. Cl.

| | | |
|---|---|---|
| *H04L 25/03* | (2006.01) | |
| *H04B 1/04* | (2006.01) | |
| *H03F 3/195* | (2006.01) | |
| *H03F 3/24* | (2006.01) | |
| *H04L 27/36* | (2006.01) | |
| *H03F 3/21* | (2006.01) | |

(52) U.S. Cl.
CPC ............. *H04B 1/0475* (2013.01); *H03F 3/195* (2013.01); *H03F 3/211* (2013.01); *H03F 3/245* (2013.01); *H04L 27/36* (2013.01); *H03F 2200/336* (2013.01); *H03F 2200/451* (2013.01); *H04B 2001/0408* (2013.01)

(58) Field of Classification Search
CPC ....... H04B 1/0475; H03F 3/195; H03F 3/245; H03F 2200/451; H03F 3/24; H03F 3/189; H04L 27/2275; H04L 2027/0067
See application file for complete search history.

(56) References Cited

U.S. PATENT DOCUMENTS

| | | | | |
|---|---|---|---|---|
| 7,433,420 | B1* | 10/2008 | Dakshinamurthy et al. | 375/296 |
| 8,670,728 | B2* | 3/2014 | Lozhkin | 455/102 |
| 2004/0092240 | A1* | 5/2004 | Hayashi | 455/214 |
| 2006/0067431 | A1* | 3/2006 | Steinbach | 375/326 |
| 2006/0181344 | A1 | 8/2006 | Ksienski et al. | |
| 2006/0273852 | A1 | 12/2006 | Chen et al. | |
| 2008/0037662 | A1* | 2/2008 | Ravi et al. | 375/260 |
| 2008/0290939 | A1 | 11/2008 | Grundlingh et al. | |
| 2011/0103508 | A1 | 5/2011 | Mu et al. | |

FOREIGN PATENT DOCUMENTS

JP 2002-057733 A 2/2002

OTHER PUBLICATIONS

International Search Report and Written Opinion for PCT/US2014/062048, filed Oct. 23, 2014.

\* cited by examiner

*Primary Examiner* — Syed Haider

(57) ABSTRACT

An apparatus includes first through fourth circuits. The first circuit determines a region of an input signal. The region is one of a plurality of regions. The second circuit generates a rotated input signal by rotating the input signal by a first angle according to the region. The third circuit phase shifts a carrier signal by a second angle according to the region. A fourth circuit amplifies the phase shifted carrier signal according to the rotated input signal. A method comprises determining a region according to a phase angle of an input signal, determining a rotation angle according to the region, generating a rotated carrier signal according to a carrier signal and the rotation angle, generating a rotated input signal according to the input signal and the negative of the rotation angle, and amplifying the rotated carrier signal according to the rotated input signal.

18 Claims, 4 Drawing Sheets

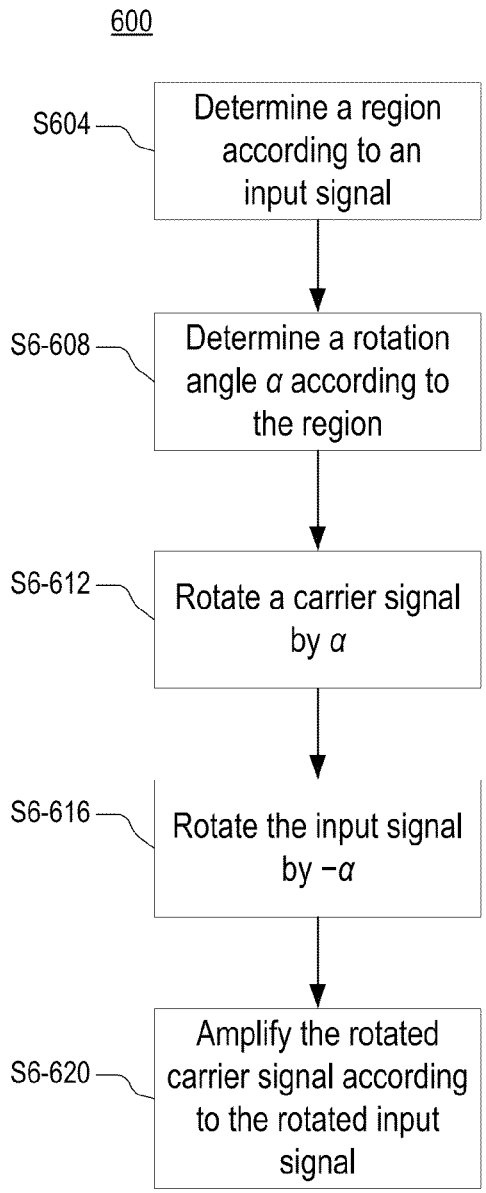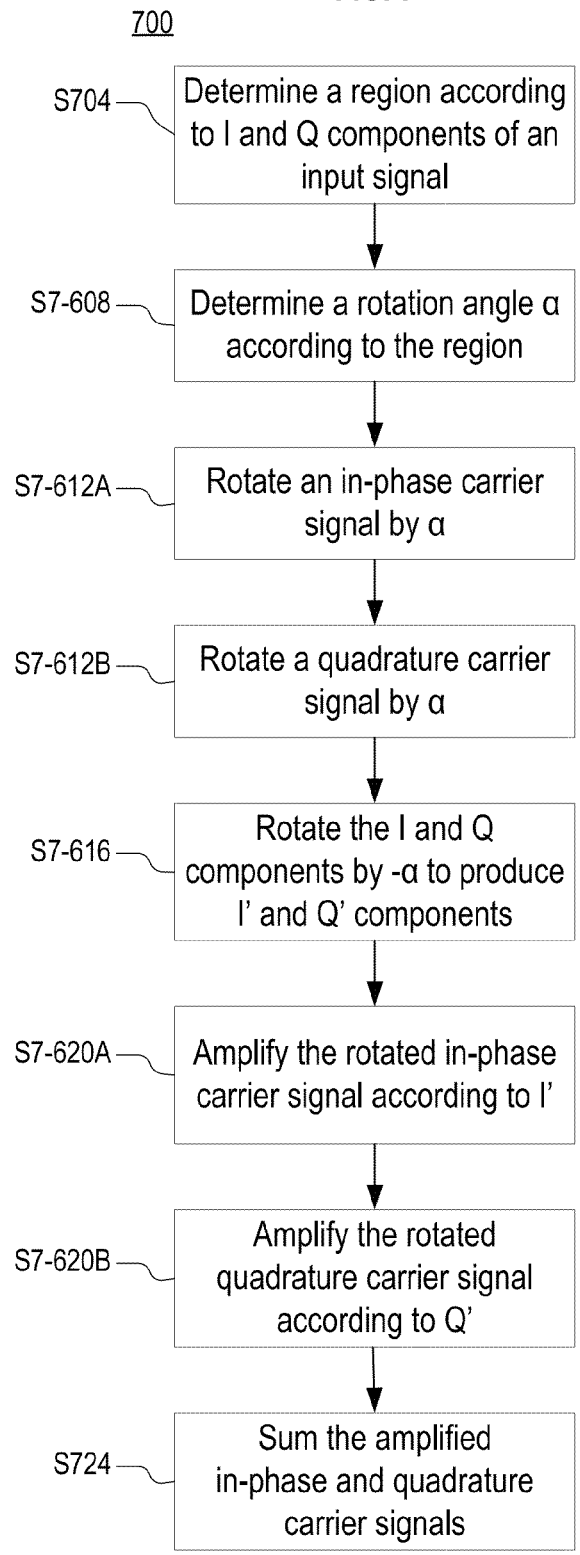

CARTESIAN DIGITAL POWER AMPLIFIER USING COORDINATE ROTATION

CROSS REFERENCE TO RELATED APPLICATION

This present disclosure claims the benefit of U.S. Provisional Application No. 61/895,015, filed on Oct. 24, 2013, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Digital Power Amplifiers (DPAs) are power amplifiers that produce an analog output signal according to a digital input signal. The conversion from digital to analog is performed within the DPA.

In addition to digital to analog conversion and amplification, the DPA may perform quadrature amplitude modulation, in which an amplitude and a phase of the output signal are modulated according to in-phase and quadrature components of the digital input signal.

SUMMARY

In an embodiment, an apparatus includes a first circuit configured to determine a region of an input signal, a second circuit configured to generate a rotated input signal by rotating the input signal by a first angle according to the region, a third circuit configured to phase shift a carrier signal by a second angle according to the region, and a fourth circuit configured to amplify the phase shifted carrier signal according to the rotated input signal. The region is one of a plurality of regions.

In an embodiment, the second angle is the negative of the first angle.

In an embodiment, the region corresponds to a plurality of phase angles.

In an embodiment, the first circuit is configured to determine the region according to a phase angle of the input signal, and the phase angle of the input signal corresponds to a phase angle of the plurality of phase angles corresponding to the region.

In an embodiment, the region includes a plurality of subregions. Each subregion corresponds to a respective contiguous range of phase angles.

In an embodiment, each subregion of the region includes a respective midpoint of the respective corresponding contiguous range of phase angles, and a midpoint of a subregion of the region is different from a midpoint of a nearest other subregion of the region by an amount substantially equal to $\pi/2$ radians.

In an embodiment, the first angle is substantially equal to a midpoint of a contiguous range of phase angles corresponding to a subregion of the region.

In an embodiment, a numeric count of regions in the plurality of regions is an integer N greater than or equal to 2, and an $n^{th}$ region includes all phase angles $\phi$ that satisfy the equation $$\frac{(n-1)\cdot\pi}{2N} \le \left(\frac{\pi}{4N} + \varphi\right) \bmod \frac{\pi}{4} < \frac{n\cdot\pi}{2N}$$

for $n = 1 \ldots N$.

In an embodiment, the first circuit is a region detector circuit, the second circuit is an input phase shifter circuit, the third circuit is a carrier phase shifter circuit, and the fourth circuit is an amplifier circuit. The amplifier circuit includes a digital power amplifier.

In an embodiment, the carrier signal is an in-phase carrier signal, the third circuit is a first carrier phase shifter circuit configured to phase shift the in-phase carrier signal, and the fourth circuit is a first amplifier circuit configured to amplify the phase shifted in-phase carrier signal according to an in-phase signal of the rotated input signal. A second carrier phase shifter circuit is configured to phase shift a quadrature carrier signal by the second angle. A second amplifier circuit is configured to amplify the phase shifted quadrature carrier signal according to a quadrature signal of the rotated input signal. A summing circuit is configured to generate an output signal according to a sum of outputs of the first and second amplifiers.

In an embodiment, the input signal includes an in-phase signal I and a quadrature signal Q, $\alpha$ is the first angle, the in-phase signal of the rotated input signal is substantially equal to $I\cdot\cos(\alpha) - Q\cdot\sin(\alpha)$, and the quadrature signal of the rotated input signal is substantially equal to $I\cdot\sin(\alpha) + Q\cdot\cos(\alpha)$.

In an embodiment, the first circuit is configured to determine the region according to the in-phase and quadrature signals of the input signal.

In an embodiment, the apparatus is provided in an integrated circuit.

In an embodiment, a method comprises determining a region from among a plurality of regions according to a phase angle of an input signal, determining a rotation angle according to the region, generating a rotated carrier signal according to a carrier signal and the rotation angle, generating a rotated input signal according to the input signal and the negative of the rotation angle, and amplifying the rotated carrier signal according to the rotated input signal.

In an embodiment, generating the rotated carrier signal includes shifting a phase of the carrier signal by the rotation angle.

In an embodiment, the rotated carrier signal is amplified using an amplifier circuit including a digital power amplifier.

In an embodiment, the carrier signal is an in-phase carrier signal, the rotated carrier signal is a rotated in-phase carrier signal, the input signal includes an in-phase signal and a quadrature signal, and the rotated input signal includes a rotated in-phase signal and a rotated quadrature signal. The method further comprises determining the region according to the in-phase and quadrature signals of the input signal, generating a rotated quadrature carrier signal according to a quadrature carrier signal and the rotation angle, amplifying the rotated in-phase carrier signal according to the rotated in-phase signal of the rotated input signal using a first amplifier circuit, amplifying the rotated quadrature carrier signal according to the rotated quadrature signal of the rotated input signal using a second amplifier circuit, and summing the amplified rotated in-phase carrier signal and the amplified rotated quadrature carrier signal. The rotated in-phase and rotated quadrature signals of the rotated input signal correspond to the in-phase and quadrature signals of the input signal rotated by the negative of the rotation angle.

In an embodiment, the rotated in-phase signal I' and the rotated quadrature signal Q' correspond, respectively, to $$I' = I \cdot \cos(-\alpha) - Q \cdot \sin(-\alpha), \text{ and}$$

$$Q' = I \cdot \sin(-\alpha) + Q \cdot \cos(-\alpha)$$

wherein I is the in-phase signal, Q is the quadrature signal, and α is the rotation angle.

In an embodiment, the region includes a plurality of subregions, each subregion corresponding to a respective contiguous range of phase angles.

In an embodiment, the method is performed using a circuit provided in an integrated circuit.

BRIEF DESCRIPTION OF THE DRAWINGS

FIG. 6 is a flowchart of a process for amplifying a signal according to an embodiment.

FIG. 7 is a flowchart of a process for amplifying a signal according to an embodiment.

DETAILED DESCRIPTION

Figure 1:
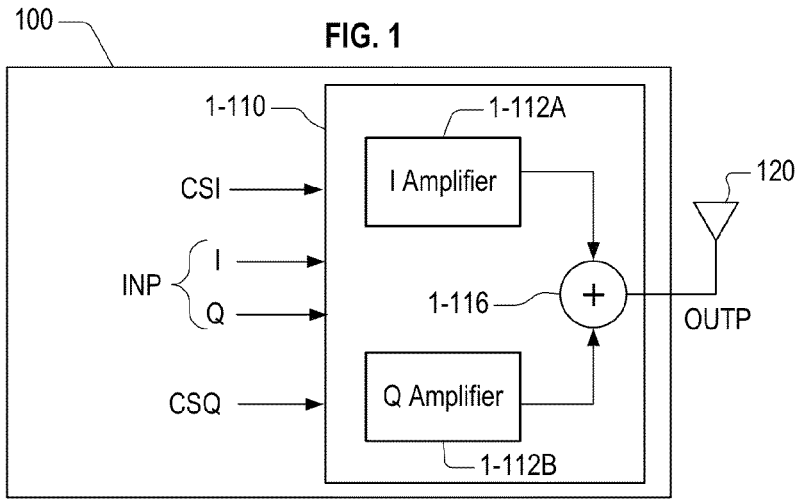
FIG. 1 illustrates a communication system including an amplifier circuit according to an embodiment.

FIG. 1 illustrates a communication system 100 including an amplifier circuit 1-110 according to an embodiment. The communication system 100 provides a baseband signal INP to the amplifier circuit 1-110, the baseband signal INP including in-phase and quadrature signals I and Q. The communication system also provides in-phase and quadrature carrier signals CSI and CSQ corresponding to a cosine and a sine of a carrier frequency ω, respectively, to the amplifier circuit 1-110.

In an embodiment, the in-phase and quadrature signals I and Q are multi-bit digital signals, the in-phase and quadrature carrier signals CSI and CSQ are digital signals, and the output signal OUTP is an analog signal.

The amplifier circuit 1-110 includes first and second Digital Power Amplifiers (DPAs) 1-112A and 1-112B. The outputs of the first and second DPAs 1-112A and 1-112B are combined by a summation circuit 1-116 to produce the output signals OUTP. The amplifier circuit 1-110 amplifies and modulates the in-phase and quadrature carrier signals CSI and CSQ according to the baseband signal INP to produce an output signal OUTP that is provided to an antenna 120.

Although FIG. 1 shows the communication system 100 providing the output signal OUTP to the antenna 120, embodiments are not limited thereto. In an embodiment, the communication system 100 provides the output signal OUTP to a coaxial cable, twisted pair, stripline, printed-circuit board trace, or other form of wired communication channel. In another embodiment, the communication system 100 provides the output signal OUTP to an optoelectronic device, such as a laser diode or optical modulator, coupled to an optical communication channel.

Figure 2:
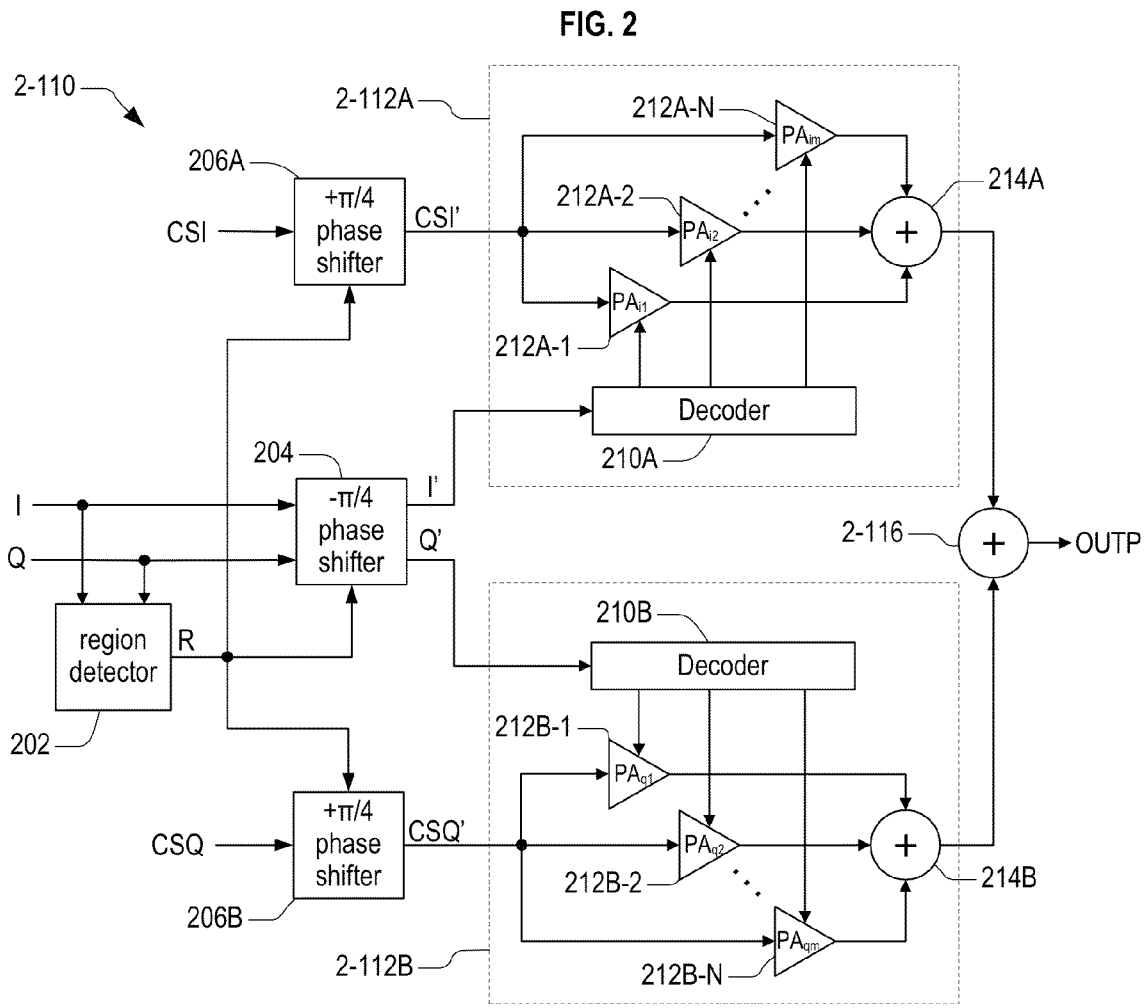
FIG. 2 illustrates an amplifier circuit according to an embodiment.

FIG. 2 illustrates an amplifier circuit 2-110 according to an embodiment. The amplifier circuit 2-110 is suitable for use in the amplifier 1-110 of FIG. 1. In an embodiment, the amplifier circuit 2-110 is provided using an integrated circuit.

The amplifier circuit 2-110 comprises a region detector circuit 202, an input signal phase shifter 204, first and second carrier signal phase shifters 206A and 206B, first and second DPAs 2-112A and 2-112B, and a final summation circuit 2-116.

The region detector circuit 202 receives the in-phase and quadrature signals I and Q and determines a region R of the input signal INP. In an embodiment, the region R corresponds to a range of phase angles corresponding to values of the in-phase and quadrature signals I and Q.

Figure 3:
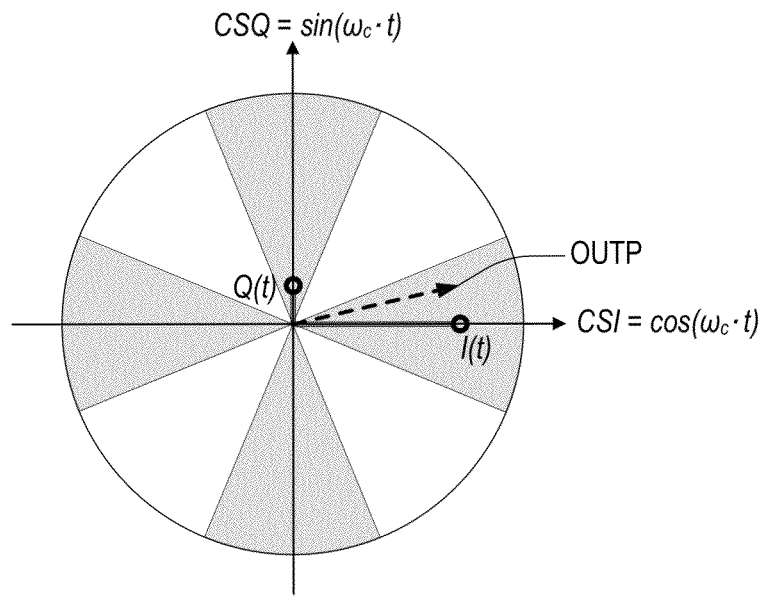
FIGS. 3 and 4 illustrate an operation of an embodiment.
Figure 4:
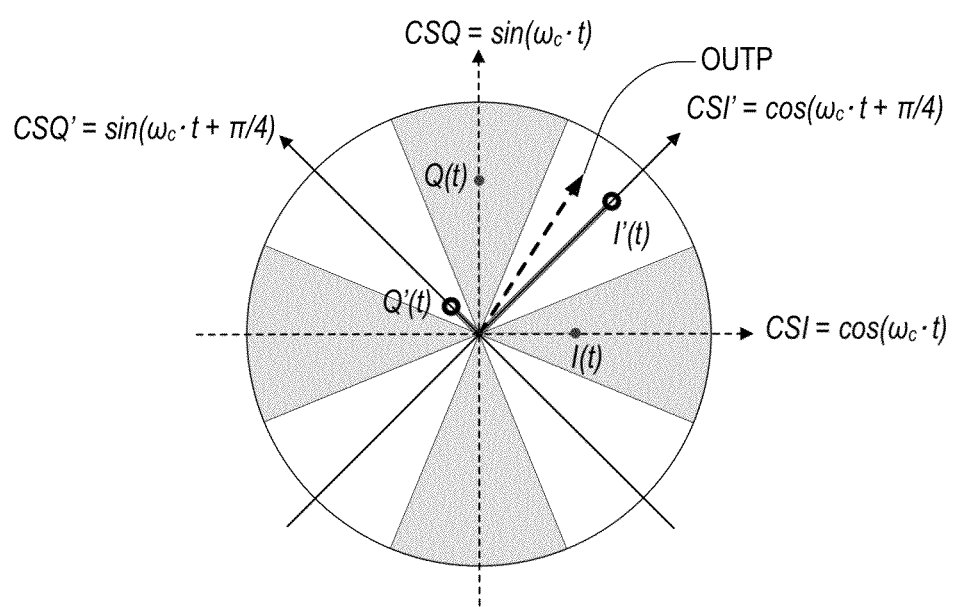

In an embodiment, a first region includes phase angles within ±22.5 degrees (±π/8 radians) of 0, 90, 180, or 270 degrees (0, π/2, π, and 3π/2 radians), illustrated as the gray regions in FIGS. 3 and 4. A second region corresponds to those phase angles not included in the first region.

In an embodiment, the region R is determined by comparing absolute magnitudes of the in-phase signal I and quadrature signal Q. In an embodiment, the region R is determined according to Equation 1:

$$R = \begin{cases} 1, & \text{if } |Q| > |I| \cdot \sin\frac{\pi}{8} \text{ and } |I| > |Q| \cdot \sin\frac{\pi}{8} \\ 0, & \text{otherwise} \end{cases} \quad \text{Equation 1}$$

In an embodiment, an approximation for the sine of π/8 is used, such as ⅜ths, to determine the region R, such as shown in Equation 2. In such an embodiment, the determination of the region R may be done using addition and subtraction circuits.

$$R = \begin{cases} 1, & \text{if } |Q| > \frac{3}{8}|I| \text{ and } |I| > \frac{3}{8}|Q| \\ 0, & \text{otherwise} \end{cases} \quad \text{Equation 2}$$

In another embodiment, a look-up table (LUT) circuit indexed according to one or more most significant bits of the in-phase and quadrature signals I and Q is used to determine the region R.

The region detection circuit 202 provides the region R to an input signal phase shifter 204 and to the first and second carrier signal phase shifters 206A and 206B. The input signal phase shifter 204 and the first and second carrier signal phase shifters 206A and 206B perform a phase shift according to the region R. Each of the first and second carrier signal phase shifters 206A and 206B performs a phase shift in an opposite direction to the phase shift performed by the input signal phase shifter 204.

The input signal phase shifter 204 performs the phase shift on the in-phase and quadrature signals I and Q to produce rotated in-phase and quadrature signals I' and Q'. In the embodiments shown in FIG. 2, wherein the region R has either a first value of 0 or a second value of 1, the input signal phase shifter 204 performs a 0 degree phase shift, that is, no phase shift, of the in-phase and quadrature signals I and Q when the region R has the first value of 0, and performs a −45 degree (−π/4 radian) phase shift of the in-phase and quadrature signals I and Q when the region R has the second value of 1, according to Equation 3:

$$I' = \begin{cases} I \cdot \cos\left(-\frac{\pi}{4}\right) - Q \cdot \sin\left(-\frac{\pi}{4}\right) = \frac{1}{\sqrt{2}}(I+Q), & R = 1 \\ I, & R = 1 \end{cases} \quad \text{Equation 3}$$

$$Q' = \begin{cases} I \cdot \sin\left(-\frac{\pi}{4}\right) + Q \cdot \cos\left(-\frac{\pi}{4}\right) = \frac{1}{\sqrt{2}}(Q-I), & R = 1 \\ Q, & R = 0 \end{cases}$$

The first and second carrier signal phase shifters 206A and 206B perform the phase shift on the in-phase and quadrature carrier signals CSI and CSQ to generate rotated in-phase and quadrature carrier signals CSI' and CSQ', respectively. The first and second carrier signal phase shifters 206A and 206B are substantially similar and operate in a substantially similar fashion, and accordingly only the first carrier signal phase shifter 206A will be described in detail herein.

As shown in Equation 4, wherein the in-phase carrier signal CSI accords to the cosine of the carrier frequency ω (i.e., CS/=cos(w·t), where t is time), when the region R has a first value of 0, the first carrier signal phase shifter 206A generates a rotated in-phase carrier signal CSI' having a 0 degree phase shift, that is, no phase shift, relative to the in-phase carrier signal CSI. When the region R has a second value of 1, the first carrier signal phase shifter 206A generates a rotated in-phase carrier signal CSI' having a 45 degree (π/4 radian) phase shift relative to the in-phase carrier signal CSI.

$$CSI' = \begin{cases} \cos(\omega \cdot t + \pi/4), & R = 1 \\ \cos(\omega \cdot t), & R = 0 \end{cases} \quad \text{Equation 4}$$

Similarly, the second carrier signal phase shifter 206B generates a rotated in-phase carrier signal CSQ' according to Equation 5, wherein the quadrature carrier signal CSQ accords to the sine of the carrier frequency ω (i.e., CSQ=sin (w·t)):

$$CSQ' = \begin{cases} \sin(\omega \cdot t + \pi/4), & R = 1 \\ \sin(\omega \cdot t), & R = 0 \end{cases} \quad \text{Equation 5}$$

In an embodiment, the in-phase carrier signal CSI is substantially a square wave having a first harmonic of cos(w·t) and the rotated in-phase carrier signal CSI' is substantially a square waves having a first harmonic according to Equation 4. The quadrature carrier signal CSQ is substantially a square wave having a first harmonic of sin(w·t) and the rotated quadrature carrier signal CSQ' is substantially a square waves having a first harmonic according to Equation 5.

A person of skill in the art in light of the teachings and disclosures herein would understand how to implement the first carrier signal phase shifter 206A. For example, the first carrier signal phase shifter 206A may perform the phase shift using one or more of an inverter, a digital delay line, a resistor-capacitor (RC) circuit, and the like.

In another embodiment, both the in-phase carrier signal CSI and a 45-degree rotated in-phase carrier signal are provided to the first carrier signal phase shifter 206A by a clock generator (not shown), and the first carrier signal phase shifter 206A generates the rotated in-phase carrier signal CSI' by selecting, according to the value of the region R, either the in-phase carrier signal CSI or the provided 45-degree rotated in-phase carrier signal. The quadrature carrier signal CSQ and a 45-degree rotated quadrature carrier signal are provided to the second carrier signal phase shifter 206B by the clock generator, and the second carrier signal phase shifter 206B generates the rotated quadrature carrier signal CSQ' by selecting, according to the value of the region R, either the quadrature carrier signal CSQ or the provided 45-degree rotated quadrature carrier signal.

The rotated in-phase signal I' and the rotated in-phase carrier signal CSI' are provided to the first DPA 2-112A. The rotated quadrature signal Q' and the rotated quadrature carrier signal CSQ' are provided to the second DPA 2-112B.

The first DPA 2-112A includes a decoder circuit 210A, a plurality of unit driver circuits 212A-1 through 212A-N, and a summing circuit 214A. The decoder circuit 210A receives the rotated in-phase signal I' and controls a state of each of the plurality of unit driver circuits 212A-1 through 212A-N according to a value of the rotated in-phase signal I'.

In an embodiment, the decoder circuit 210A controls a number of the plurality of unit driver circuits 212A-1 through 212A-N according to a value of the rotated in-phase signal I' to be in an on state, and the controls the remainder of the plurality of unit driver circuits 212A-1 through 212A-N to be in an off state. For example, when the value of the rotated in-phase signal I' is 5, the decoder circuit 210A controls five of the plurality of unit driver circuits 212A-1 through 212A-N to be in the on state, and controls the remainder of the plurality of unit driver circuits 212A-1 through 212A-N to be in an off state. In an embodiment wherein the values of the rotated in-phase signal I' are encoded in B bits, a numeric count of unit driver circuits in the plurality of unit driver circuits 212A-1 through 212A-N is $2^B-1$.

When a unit driver circuit of the plurality of unit driver circuits 212A-1 through 212A-N is in an on state, that unit driver circuit provides an amount of current substantially equal to a predetermined unit current value to the first summing circuit 214A. The first summing circuit 214A produces an output of the first DPA 2-112A according to the sum of the currents provided thereto by the plurality of unit driver circuits 212A-1 through 212A-N.

The second DPA 2-112B includes a decoder circuit 210B, a plurality of unit driver circuits 212B-1 through 212B-N, and a second summing circuit 214B. The second DPA 2-112B is substantially similar to the first DPA 2-112A and operate in a substantially similar fashion, and accordingly a detailed description of the second DPA 2-112B will be omitted. The second DPA 2-112B produces an output according to the rotated quadrature signal Q' and the rotated quadrature carrier signal CSQ'.

The final summation circuit 2-116 combines the outputs of the first and second DPAs 2-112A and 2-112B to produce the output signal OUTP according to Equation 6:

$$OUTP = I' \cdot CSI' + Q' \cdot CSQ' \quad \text{Equation 6}$$

or equivalently:

$$OUTP = \begin{cases} (I+Q) \cdot \cos\left(\omega \cdot t + \frac{\pi}{4}\right) + \\ \frac{(Q-I) \cdot \sin\left(\omega \cdot t + \frac{\pi}{4}\right)}{\sqrt{2}}, & R = 1 \\ I \cdot \cos(\omega \cdot t) + Q \cdot \sin(\omega \cdot t), & R = 0 \end{cases} \quad \text{Equation 7}$$

Although specific embodiments of the first and second DPAs 2-112A and 2-112B have been described, embodiments are not limited thereto. A person of skill in the art in light of the teachings and disclosures herein would understand how to implement the first and second DPAs 2-112A and 2-112B, and how to implement the final summation circuit 2-116.

FIGS. 3 and 4 illustrate the operation of the amplifier circuit 2-110 of FIG. 2 in the first and second regions, respectively.

FIG. 3 shows operation when the value of the input signal INP corresponds to the first region (R=0). In FIG. 3, no rotation of the input signal INP or the carrier signals CSI and CSQ is performed. The value of the output signal OUTP is equal to I·CSI+Q·CSQ.

FIG. 4 illustrate operation when the input signal INP corresponds to the second region (R=1). In FIG. 4, the in-phase and quadrature carrier signals CSI and CSQ are rotated by π/4 radians (45 degrees) to produce the rotated in-phase and quadrature carrier signals CSI' and CSQ', respectively. The input signals I and Q are rotated by −π/4 radians (−45 degrees) to produce the rotated input signals I' and Q'. The value of the output signal OUTP is equal to I'·CSI'+Q'·CSQ'.

Figure 5A:
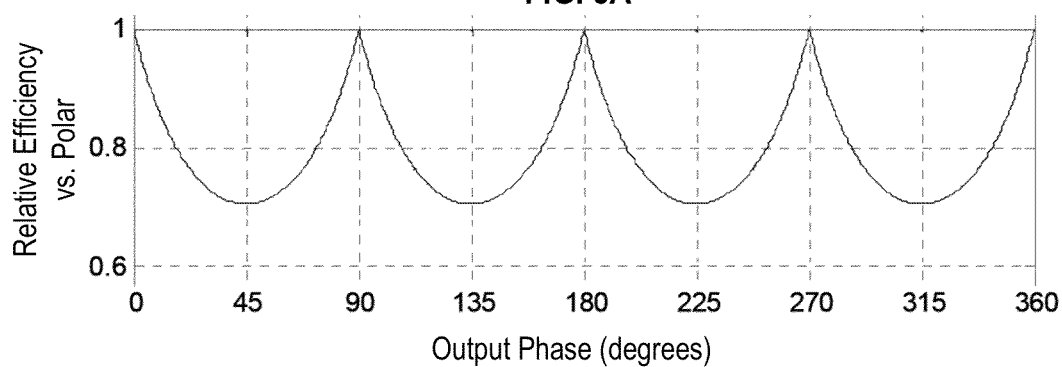
FIGS. 5A and 5B show a relative efficiency of an amplifier of the related arts and an amplifier according to an embodiment, respectively.
Figure 5B:
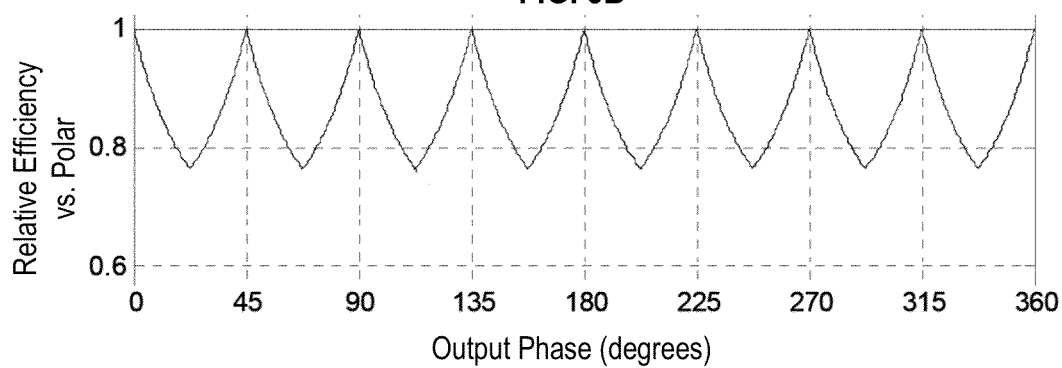

FIGS. 5A and 5B show relative efficiency of amplifiers of the related arts and an amplifier according to an embodiment, respectively.

FIG. 5A shows the efficiency of a Cartesian DPA of the related arts relative to a polar DPA of the related arts according to a phase of the output signal. FIG. 5 shows that the efficiency of the Cartesian DPA of the related arts is substantially lower than that of the polar DPA of the related arts when the phase of the output signal is at or near 45, 135, 225, and 315 degrees.

FIG. 5B shows the efficiency of a DPA according to an embodiment having two regions, relative to the polar DPA of the related arts. Comparing FIGS. 5A and 5B shows that the efficiency of the DPA according to the embodiment is substantially improved compared to the Cartesian DPA of the related arts when the output phase is at or near 45, 135, 225, and 315 degrees.

Although FIG. 2 illustrates an embodiment having two regions, embodiments are not limited thereto. An embodiment may have N regions, where N is an integer greater than or equal to 2, and the region R may be determined according to Equation 8 or a substantially equivalent approximation thereof:

$$R = n \qquad \text{Equation 8}$$

where $$\frac{n \cdot \pi}{2N} \le \left(\frac{\pi}{4N} + \tan^{-1}\frac{Q}{I}\right) \bmod \frac{\pi}{4} < \frac{(n+1) \cdot \pi}{2N},$$

$$n = 0, \ldots, N-1$$

The rotated in-phase signal I', rotated quadrature signal Q', rotated in-phase carrier signal CSI', rotated quadrature carrier signal CSQ', and output signal OUTP are then generated according to Equations 9 through 13, respectively:

$$I' = I \cdot \cos\left(-\frac{R \cdot \pi}{2N}\right) - Q \cdot \sin\left(-\frac{R \cdot \pi}{2N}\right) \qquad \text{Equation 9}$$

$$Q' = I \cdot \sin\left(-\frac{R \cdot \pi}{2N}\right) + Q \cdot \cos\left(-\frac{R \cdot \pi}{2N}\right) \qquad \text{Equation 10}$$

$$CSI' = \cos\left(\omega \cdot t + \frac{R \cdot \pi}{2N}\right) \qquad \text{Equation 11}$$

$$CSQ' = \sin\left(\omega \cdot t + \frac{R \cdot \pi}{2N}\right) \qquad \text{Equation 12}$$

$$OUTP = I' \cdot CSI' + Q' \cdot CSQ' \qquad \text{Equation 13}$$

FIG. 6 is a flowchart of a process 600 for amplifying a signal according to an embodiment.

At S604, a region R of a plurality of regions is determined, using a region detection circuit, according to a value of an input signal. Each region corresponds to a plurality of phase angle ranges for the value of the input signal. In an embodiment, each region includes four subregions. Each subregion of a region includes a contiguous range of phase angles, and a midpoint of the contiguous range of phase angles of each subregion of the region is different from a midpoint of the contiguous range of phase angles of a nearest other subregion of the region by π/2 radians.

In an embodiment wherein a numeric count of regions in the plurality of regions is 2, a first region includes phase angles from −π/8 to π/8 radians, from 3·π/8 to 5·π/8 radians, from 7·π/8 to 9·π/8 radians, and from 11·π/8 to 13·π/8 radians. A second region includes the remaining phase angles.

In another embodiment wherein a numeric count of regions in the plurality of regions is an integer N greater than 2, each $n^{th}$ region includes all phase angles φ that satisfy Equation 14, i for n=1 to N:

$$\frac{(n-1) \cdot \pi}{2N} \le \left(\frac{\pi}{4N} + \varphi\right) \bmod \frac{\pi}{4} < \frac{n \cdot \pi}{2N} \qquad \text{Equation 14}$$

At S6-608, a rotation angle α is determined according to the region R. In an embodiment, the rotation angle is substantially equal to a central phase angle of a contiguous portion of the phase angles included in the region R. For example, in the embodiment having two regions described above, the rotation angle α is determined to be 0 radians when the region R is the first region and determined to be π/4 radians when the region R is the second region. In an embodiment having N regions, the rotation angle α determined for an $n^{th}$ region of a plurality of regions 1 to N is determined according to Equation 15:

$$\alpha \cong \frac{(n-1)\pi}{2N} \qquad \text{Equation 15}$$

At S6-612, a carrier signal is rotated by the rotation angle α using a first phase shifter circuit. At S6-616, the input signal is rotated by a negative of the rotation angle α (that is, by −α) by a second phase shifter circuit.

At S6-620, the rotated carrier signal is amplified, using an amplifier circuit, according to the rotated input signal. In an embodiment, the amplifier circuit includes a Digital Power Amplifier (DPA).

FIG. 7 is a flowchart of a process 700 for amplifying a signal according to an embodiment.

At 5704, a region R of a plurality of regions is determined, using a region detection circuit, according to in-phase (I) and quadrature (Q) components of a value of an input signal. Each region corresponds to a plurality of phase angle ranges for the value of the input signal, wherein the phase angle φ=tan$^{-1}$(Q/I). In some embodiments, the regions are defined as described for the process 600 of FIG. 6. In an embodiment, the regions are defined according to a Look-Up Table (LUT) or equivalent circuit, the LUT being accessed according to a plurality of bits of the I and Q components. In an embodiment, the plurality of bits of the I and Q components include most significant bits of the I and Q components, respectively.

At S7-608, a rotation angle α is determined according to the region R. In an embodiment, the rotation angle is substantially equal to a central phase angle of a contiguous portion of the phase angles included in the region R, as described for the process 600 of FIG. 6.

At S7-612A, an in-phase carrier signal is rotated by the rotation angle α using a first phase shifter circuit. At S7-612B, a quadrature carrier signal is rotated by the rotation angle α using a second phase shifter circuit.

At S7-616, the I and Q components of the input signal are rotated by a negative of the rotation angle α (that is, by −α) by a third phase shifter circuit to produce I' and Q' components.

At S7-620A, the rotated in-phase carrier signal is amplified, using a first amplifier circuit, according to the I' component. At S7-620B, the rotated quadrature carrier signal is amplified, using a second amplifier circuit, according to the Q' component. In an embodiment, the first and second amplifier circuits include Digital Power Amplifiers (DPA).

At S724, outputs of the first and second amplifier circuits are combined using a summing circuit.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. An apparatus comprising:
a first circuit configured to determine a region of an input signal, the region being one of a plurality of regions;
a second circuit configured to generate a rotated input signal by rotating the input signal by a first angle according to the region;
a third circuit configured to phase shift a carrier signal by a second angle according to the region; and
a fourth circuit configured to amplify the phase shifted carrier signal according to the rotated input signal,
wherein a numeric count of regions in the plurality of regions is an integer N greater than or equal to 2, and
wherein an $n^{th}$ region includes all phase angles ϕ that satisfy the equation $$\frac{(n-1)\pi}{2N} \leq \left(\frac{\pi}{4N} + \varphi\right) \bmod \frac{\pi}{4} < \frac{n \cdot \pi}{2N}$$

for $n = 1 \ldots N$.

2. The apparatus of claim 1, wherein the second angle is the negative of the first angle.

3. The apparatus of claim 1, wherein the region corresponds to a plurality of phase angles.

4. The apparatus of claim 3, wherein the first circuit is configured to determine the region according to a phase angle of the input signal, and wherein the phase angle of the input signal corresponds to a phase angle of the plurality of phase angles corresponding to the region.

5. The apparatus of claim 3, wherein the region includes a plurality of subregions, each subregion corresponding to a respective contiguous range of phase angles.

6. The apparatus of claim 5, wherein each subregion of the region includes a respective midpoint of the respective corresponding contiguous range of phase angles, and wherein a midpoint of a subregion of the region is different from a midpoint of a nearest other subregion of the region by an amount substantially equal to π/2 radians.

7. The apparatus of claim 5, wherein the first angle is substantially equal to a midpoint of a contiguous ranue of phase angles corresponding to a subregion of the region.

8. The apparatus of claim 1, wherein the first circuit is a region detector circuit, the second circuit is an input phase shifter circuit, the third circuit is a carrier phase shifter circuit, and the fourth circuit is an amplifier circuit, the amplifier circuit being a digital power amplifier.

9. The apparatus of claim 1, wherein the carrier signal is an in-phase carrier signal, wherein the third circuit is a first carrier phase shifter circuit configured to phase shift the in-phase carrier sitmal, wherein the fourth circuit is a first amplifier circuit configured to amplify the phase shifted in-phase carrier signal according to an in-phase signal of the rotated input signal, and wherein the apparatus further comprises:
a second carrier phase shifter circuit configured to phase shift a quadrature carrier signal by the second angle;
a second amplifier circuit configured to amplify the phase shifted quadrature carrier signal according to a quadrature signal of the rotated input signal; and
a summing circuit configured to generate an output signal according to a sum of outputs of the first and second amplifiers.

10. The apparatus of claim 9, wherein the input signal includes an in-phase signal I and a quadrature signal Q, where α is the first angle, the in-phase signal of the rotated input signal is substantially equal to I•cos(α)−Q•sin(α), and the quadrature signal of the rotated input signal is substantially equal to I•sin(α) +Q•cos(α).

11. The apparatus of claim 10, wherein the first circuit is configured to determine the region according to the in-phase and quadrature signals of the input signal.

12. The apparatus of claim 1, wherein the apparatus is provided in an integrated circuit.

13. A method comprising:
determining, by a first circuit, a region from among a plurality of regions according to a phase angle of an input signal;
determining a rotation angle according to the region;
generating, by a second circuit, a rotated carrier signal according to a carrier signal and the rotation angle;
generating, by a third circuit, a rotated input signal according to the input signal and the negative of the rotation angle; and
amplifying the rotated carrier signal according to the rotated input signal,
wherein a numeric count of regions in the plurality of regions is an integer N greater than or equal to 2, and
wherein an $n^{th}$ region includes all phase angles ϕ that satisfy the equation $$\frac{(n-1)\pi}{2N} \leq \left(\frac{\pi}{4N} + \varphi\right) \bmod \frac{\pi}{4} < \frac{n \cdot \pi}{2N}$$

for $n = 1 \ldots N$.

14. The method of claim 13, wherein generating the rotated carrier signal includes shifting a phase of the carrier signal by the rotation angle.

15. The method of claim 13, wherein the rotated carrier signal is amplified using an amplifier circuit including a digital power amplifier.

16. The method of claim 13, wherein the carrier signal is an in-phase carrier signal, the rotated carrier signal is a rotated in-phase carrier signal, the input signal includes an in-phase signal and a quadrature signal, and the rotated input signal includes a rotated in-phase signal and a rotated quadrature signal, and wherein the method further comprises:
- determining the region according to the in-phase and quadrature signals of the input signal;
- generating a rotated quadrature carrier signal according to a quadrature carrier signal and the rotation angle;
- amplifying the rotated in-phase carrier signal according to the rotated in-phase signal of the rotated input signal using a first amplifier circuit;
- amplifying the rotated quadrature carrier signal according to the rotated quadrature signal of the rotated input signal using a second amplifier circuit; and
- summing the amplified rotated in-phase carrier signal and the amplified rotated quadrature carrier signal, wherein the rotated in-phase and rotated quadrature signals of the rotated input signal correspond to the in-phase and quadrature signals of the input signal rotated by a negative of the rotation angle.

17. The method of claim 16, wherein the rotated in-phase signal I' and the rotated quadrature signal Q' correspond, respectively, to $$I' = I \cdot \cos(-\alpha) - Q \cdot \sin(-\alpha), \text{ and}$$

$$Q' = I \cdot \sin(-\alpha) + Q \cdot \cos(-\alpha)$$

wherein I is the in-phase signal, Q is the quadrature signal, and $\alpha$ is the rotation angle.

18. The method of claim 13, wherein the method is performed using a circuit provided in an integrated circuit.

* * * * *